(12) United States Patent
Yoshida et al.

(10) Patent No.: US 8,729,534 B2
(45) Date of Patent: May 20, 2014

(54) ORGANIC EL DISPLAY PANEL

(75) Inventors: Hidehiro Yoshida, Osaka (JP); Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 232 days.

(21) Appl. No.: 13/381,236

(22) PCT Filed: Jun. 11, 2010

(86) PCT No.: PCT/JP2010/003909
§ 371 (c)(1),
(2), (4) Date: Dec. 28, 2011

(87) PCT Pub. No.: WO2011/001614
PCT Pub. Date: Jan. 6, 2011

(65) Prior Publication Data
US 2012/0112217 A1    May 10, 2012

(30) Foreign Application Priority Data

Jun. 29, 2009   (JP) ................................. 2009-154240

(51) Int. Cl.
*H01L 29/08*       (2006.01)
(52) U.S. Cl.
USPC .................. 257/40; 257/89; 257/E51.022
(58) Field of Classification Search
USPC ..................... 257/89, 40, E51.022
See application file for complete search history.

(56) References Cited

U.S. PATENT DOCUMENTS

| 7,459,177 | B2 | 12/2008 | Kimura et al. |
| 2005/0212841 | A1 | 9/2005 | Okano |
| 2005/0260335 | A1 | 11/2005 | Kimura et al. |
| 2006/0124920 | A1 | 6/2006 | Kimura |
| 2007/0052119 | A1 | 3/2007 | Sakai et al. |
| 2007/0052199 | A1 | 3/2007 | Schulte et al. |
| 2007/0145350 | A1 | 6/2007 | Kobori |
| 2007/0241665 | A1 | 10/2007 | Sakanoue et al. |
| 2011/0140596 | A1 | 6/2011 | Yoshida et al. |

FOREIGN PATENT DOCUMENTS

| JP | 2003-272855 A | 9/2003 |
| JP | 2003-279723 A | 10/2003 |
| JP | 2005-270725 A | 10/2005 |

(Continued)

OTHER PUBLICATIONS

International Search Report for PCT/JP2010/003909 dated Aug. 31, 2010.

*Primary Examiner* — Matthew Reames
(74) *Attorney, Agent, or Firm* — Pearne & Gordon LLP

(57) ABSTRACT

Disclosed is an organic EL display panel provided with a substrate and a plurality of sub-pixels that are disposed in a matrix upon the substrate, wherein: the sub-pixels comprise sub-pixels that emit red light, sub-pixels that emit green light, and sub-pixels that emit blue light; the sub-pixels are each provided with a pixel electrode that is disposed upon the substrate, an organic functional layer that is formed by coating upon the pixel electrode, a counter electrode that is disposed upon the organic functional layer, and a bank that defines the space in which the organic functional layer is formed; the sub-pixels include sub-pixels (X) that are disposed on at least one section of the edge of the substrate, and sub-pixels (Y) that are disposed in the center of the substrate and that emit light with the same color as the sub-pixels (X); the volume of the organic functional layer provided in the sub-pixels (X) is larger than the volume of the organic functional layer provided in the sub-pixels (Y); and the sizes of the space defined by the bank provided in the sub-pixels (X) are the same as the sizes of the space defined by the bank provided in the sub-pixels (Y).

3 Claims, 5 Drawing Sheets

(56) References Cited

FOREIGN PATENT DOCUMENTS

| | | |
|---|---|---|
| JP | 2006-003870 A | 1/2006 |
| JP | 2006-155978 A | 6/2006 |
| JP | 2006-260779 A | 9/2006 |
| JP | 2007-103349 A | 4/2007 |
| JP | 2007-157514 A | 6/2007 |
| JP | 2007-287586 A | 11/2007 |
| JP | 2008-016205 A | 1/2008 |
| JP | 2008-112844 A | 5/2008 |
| JP | 2009-117392 A | 5/2009 |

ORGANIC EL DISPLAY PANEL

TECHNICAL FIELD

The present invention relates to an organic EL display panel.

BACKGROUND ART

Organic EL display panels include luminescent elements that utilize the electroluminescent properties of certain organic compounds (organic EL elements).

An organic EL display panel is manufactured by arranging onto a substrate a matrix of sub-pixels (organic EL elements) of three different colors: red (R), green (G), and blue (B). Each set of R, G, and B organic EL elements constitutes one pixel. The respective organic EL elements are manufactured by arranging, in order, pixel electrodes (e.g., anodes), organic emitting layers, and counter electrodes (e.g., cathodes) onto a substrate. In some cases, a functional layer including an electron injection layer, an electron transport layer, a hole transport layer, a hole injection layer, and the like is also formed.

The organic EL elements are typically of three types: organic EL element R which emits red light; organic EL element G which emits green light; and organic EL element B which emits blue light. In some cases, as all of the organic emitting layers, white light-emitting luminescent layers may be made while providing color filters that change white light to desired colored light. In other cases, an organic red light-, green light-, or blue light-emitting layer is provided for each of the organic EL elements.

The functional layer including an organic emitting layer, a hole injection layer, and a hole transport layer is formed for instance by applying a coating solution of functional layer materials onto a substrate and drying the coating solution. More specifically, banks made of resin or the like are formed over the surface of the substrate to define spaces for each of R, G and B, where such a functional layer is to be provided. Subsequently, the coating solution is applied in the corresponding spaces defined by the banks and dried to form the functional layer.

When forming the functional layer by the coating method in this way, it is possible that the drying rate of coating solution differs between the center coating region (a region where a functional layers is to be formed) and the surrounding edge coating region of the panel. Variations in drying rates result in variations in thicknesses of functional layers to be formed. The variations in functional layer thickness among pixels lead to luminance variations across the display.

In an effort to overcome this problem, technologies have been proposed in which the coating region (a region where the functional layer is to be formed) at the edge of the panel (edge coating region) is made larger than the coating region at the center of the panel (center coating region) (see e.g., Patent Literature 1). In Patent Literature 1, the edge coating region is made larger than the center coating region, allowing the larger coating region to hold more coating solution than the smaller one. In this way, the difference in drying rate of coating solution between the center and edge coating regions of the panel is corrected.

Other proposed technologies involve setting the amount of solvent contained in the coating solution to be applied in the edge coating region of the panel larger than the amount of solvent contained in the coating solution to be applied on the center coating region, so that the difference in drying rate of the coating solution between the center and edge coating regions is corrected (see, e.g., Patent Literature 2). According to Patent Literature 2, although the volume of solvent of coating solution to be applied in each coating region varies, the organic material contained in the coating solution to be applied in each coating region is constant.

Yet another proposed technologies involve providing a pixel electrode-free region (dummy region) that surrounds a luminescent region consisting of a matrix of pixels, so that luminance variation across the display that occurs due to the difference in drying rate between the center region and surrounding edge region of the panel can be avoided (see, e.g., Patent Literatures 3 to 6).

Providing such a dummy region around the perimeter of the luminescent region and applying a coating solution in the dummy region in this way results in the formation of functional layers of varying thickness in the dummy region, which is not a luminescent region. However, the dummy region can reduce variations in drying rates of coating solutions across the luminescent region positioned at the center of the panel, so that the functional layers to be formed in the luminescent region are uniform in thickness among pixels. In this way, it is possible to reduce luminance variations across the display.

Moreover, as a technology for enhancing light extraction efficiency from organic EL elements, it has been reported to employ a transparent electrode for either of the pixel electrode and counter electrode; employ a reflective electrode for the other while disposing a transparent conductive film by sputtering or the like between the organic emitting layer and reflective electrode (see, e.g., Patent Literature 7). By appropriately adjusting the optical distance between the organic emitting layer and reflective electrode by means of the transparent conductive film disposed between them, the light beam reflected by the reflective electrode and then travels toward the transparent electrode and the light beam that directly travels toward the transparent electrode are combined together to increase light extraction efficiency.

CITATION LIST

Patent Literature

PTL 1
Japanese Patent Application Laid-Open No. 2008-16205
PTL 2
Japanese Patent Application Laid-Open No. 2006-260779
PTL 3
Japanese Patent Application Laid-Open No. 2007-103349
PTL 4
Japanese Patent Application Laid-Open No. 2006-3870
PTL 5
U.S. Patent Application Publication No. 2007/0052199
PTL 6
U.S. Pat. No. 7,459,177
PTL 7
Japanese Patent Application Laid-Open No. 2003-272855

SUMMARY OF INVENTION

Technical Problem

While the technologies as disclosed by Patent Literature 1 or 2 can correct the difference in drying rate between the center and edge regions of the organic EL panel, these technologies cannot solve the problem of variations in the shapes and thicknesses of the functional layers among pixels. The variations in the thicknesses of functional layers cause luminance variations across the organic EL display panel.

With references to FIGS. 1A to 1D, the mechanism by which the shapes and thicknesses of the functional layer become non-uniform among pixels will be described.

FIG. 1A is a cross-sectional view illustrating an organic EL display panel without functional layers. The organic EL display panel illustrated in FIG. 1A includes spaces for sub-pixels (organic EL elements) 130R, 130G, and 130B arranged on substrate 110. The adjacent sub-pixels are separated by banks 170 formed on substrate 110. Sub-pixel 130R will be configured to emit red light, sub-pixel 130G will be configured to emit green light, and sub-pixel 130B will be configured to emit blue light. The organic EL display panel will include sub-pixel 130RX positioned at the edge of the panel, and sub-pixel 130RY positioned at the center of the panel.

FIG. 1B illustrates a state where coating solution 140 of functional layer has been applied in regions defined by bank 170. FIG. 1C illustrates a state where coating solution 140 in the regions defined by banks 170 is being dried out. Drying of coating solution 140 is accelerated around the edge of the panel due to low solvent vapor concentrations. Because coating solution 140 thus applied moves to parts where drying rates thereof are high by convection, coating solution 140 constituting functional layer 180 of sub-pixel 130RX is pulled toward the edge of the panel.

FIG. 1D illustrates the shapes of functional layers 180 formed. FIG. 2A is an enlarged view illustrating sub-pixel 130RX in FIG. 1D. FIG. 2B is an enlarged view illustrating sub-pixel 130RY in FIG. 1D. As described above, since coating solution 140 in sub-pixel 130RX is pulled toward the edge of the panel during drying of coating solution 140, edge 181 of functional layer 180 formed in sub-pixel 130RX, which edge is positioned on the substrate edge side, becomes high compared to edge 182 of functional layer 180 positioned on the center side of the substrate. When functional layers are formed by coating in this way, the functional layers in the sub-pixels arranged at the perimeter of the substrate are thicker on the substrate edge side of the coating space. Therefore, thickness T of functional layer 180 of sub-pixel 130RX decreases compared to thickness T' of functional layer 180 of sub-pixel 130RY.

It is therefore an object of the present invention to provide organic EL display panels free of luminance variations, by providing means of making the thicknesses of functional layers uniform across the display panel.

Solution to Problem

The inventors established that variations in thickness can be corrected by adjusting the volume of functional layer material to be supplied according to the position of sub-pixels. The inventors conducted additional studies and completed the present invention.

Specifically, the present invention relates to organic EL display panels given below.

[1] An organic EL display panel including:
  a substrate; and
  a matrix of multiple sub-pixels disposed on the substrate, wherein: the sub-pixels include a sub-pixel which emits red light, a sub-pixel which emits green light, and a sub-pixel which emits blue light;
  each of the sub-pixels has a pixel electrode disposed on the substrate, an organic functional layer formed on the pixel electrode by coating, a counter electrode disposed on the organic functional layer, and a bank for defining a space in which the organic functional layer is formed;
  the sub-pixels include a sub-pixel X disposed at least in part of an edge of the substrate, and a sub-pixel Y that is disposed at a center of the substrate and emits the same color of light as the sub-pixel X;
  a volume of the organic functional layer in the sub-pixel X is larger than a volume of the organic functional layer in the sub-pixel Y; and
  a size of the space defined by the bank of the pixel X and a size of the space defined by the bank of the sub-pixel Y are the same.

[2] The organic EL display panel according to [1] above, wherein a hole transport layer in the organic functional layer of the sub-pixel X has a different volume from a hole transport layer in the organic functional layer of the sub-pixel Y.

[3] The organic EL display panel according to [1] above, wherein an organic emitting layer and a hole transport layer in the organic functional layer of the sub-pixel X have a different volume from an organic emitting layer and a hole transport layer in the organic functional layer of the sub-pixel Y, respectively.

Advantageous Effects of Invention

The present invention can prevent organic functional layers provided in sub-pixels arranged at the edge of the substrate from being thicker on the substrate edge side and thereby can make their thicknesses uniform among pixels. Thus, the present invention can provide organic EL display panels with uniform luminance.

DESCRIPTION OF EMBODIMENTS

Figure 1A:
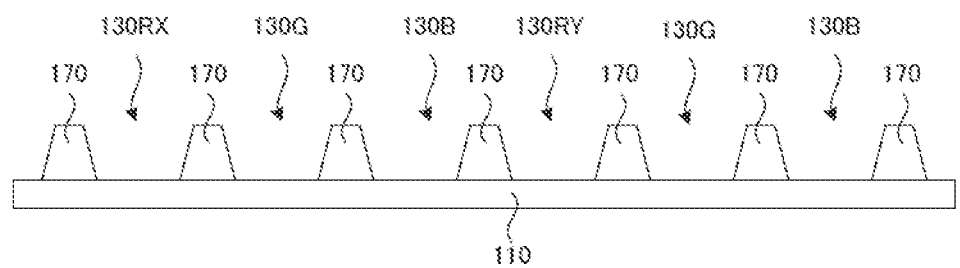
FIGS. 1A to 1D illustrate the behavior of a coating solution of a functional layer during formation of the functional layer by coating.
Figure 1B:
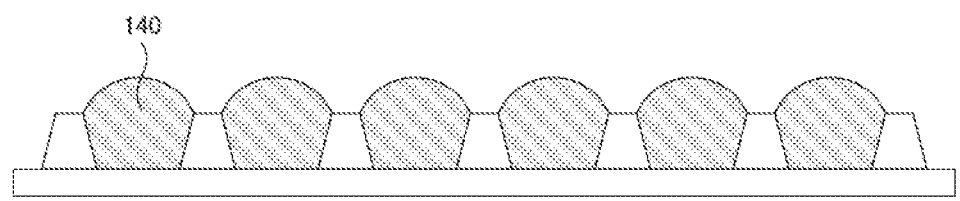
Figure 1C:
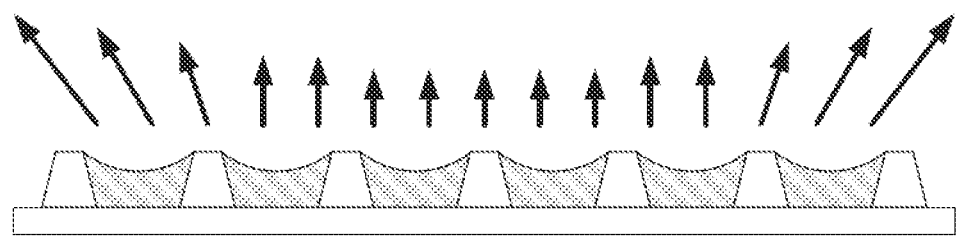
Figure 1D:
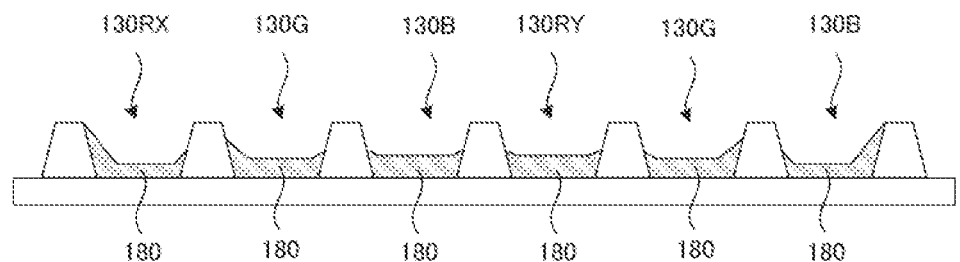

An organic EL display panel of the present invention includes a substrate and a matrix of multiple sub-pixels (organic EL elements) arranged on the substrate.

[Substrate]

The choice of the material of the substrate varies depending on whether the organic EL display panel according to the present invention is of bottom emission type or top emission type. In the case of bottom emission type, the material of the substrate is not specifically limited so long as it is transparent and insulating. Examples of such materials include glass and transparent resins. In the case of top emission type, on the other hand, the material is not specifically limited so long as it is insulating. The size and thickness of the substrate are appropriately determined depending on the size of the organic EL display panel to be manufactured, the type of the substrate material, or the like.

The substrate may further include thin film transistors for driving organic EL elements (driving TFTs). The source electrode or drain electrode of a TFT is connected to a pixel electrode described later.

[Sub-Pixel]

Sub-pixels (organic EL elements) include three types of sub-pixels: sub-pixels which emit red light, sub-pixels which emit green light, and sub-pixels which emit blue light. Each set of R, G, and B sub-pixels constitutes one pixel. According to the present invention, a sub-pixel disposed at the edge of the substrate (substrate edge) is referred to as "sub-pixel X," and a sub-pixel disposed at the center of the substrate (substrate center) and emits the same color of light as sub-pixel X is referred to as "sub-pixel Y." As used herein, "substrate edge" not only means the perimeter of the substrate, but also means the relatively outside region with respect to "substrate center." Likewise, "substrate center" not only means the center point of the substrate, but also means the region located relatively near the center point with respect to "substrate edge." That is, "substrate edge" and "substrate center" are relative positions of certain two regions.

The sub-pixels arranged on the substrate each include 1) a pixel electrode, 2) a bank, 3) an organic functional layer, and 4) a counter electrode, each of which will be described below.

1) Pixel Electrode

The pixel electrode is a conductive member arranged on the substrate, which typically functions as an anode but may function as a cathode in some cases. The pixel electrode may have a film made of transition metal oxide (e.g., tungsten oxide or molybdenum oxide) formed on the surface. The transition metal oxide film formed on the surface of the pixel electrode functions as a hole injection layer.

The choice of the material of the pixel electrode varies depending on whether the organic EL display panel according to the present invention is of bottom emission type or top emission type. In the case of bottom emission type, the material of the pixel electrode is not specifically limited so long as it is transparent and electrically conducive. Examples of such materials include indium tin oxide (ITO), indium zinc oxide (IZO), and zinc oxide (ZnO). In the case of top emission type, on the other hand, the material of the pixel electrode is not specifically limited so long as it is light reflective and electrically conductive. Examples of such materials include silver-containing alloys, more specifically, Ag—Pd—Cu (APC) alloys and Ag—Ru—Au (ARA) alloys; molybdenum-chrome (MoCr) alloys; nickel-chrome (NiCr) alloys; and aluminum-neodymium (Al—Nd) alloys. The light-reflective pixel electrodes may include all ITO or IZO film formed on the surface.

2) Bank

The bank constitutes an insulator that defines a space to be coated with an organic functional layer (hereinafter also referred to as "coating space"). In the present invention, the bank may define a matrix of coating spaces or lines of coating spaces.

Figure 3A:
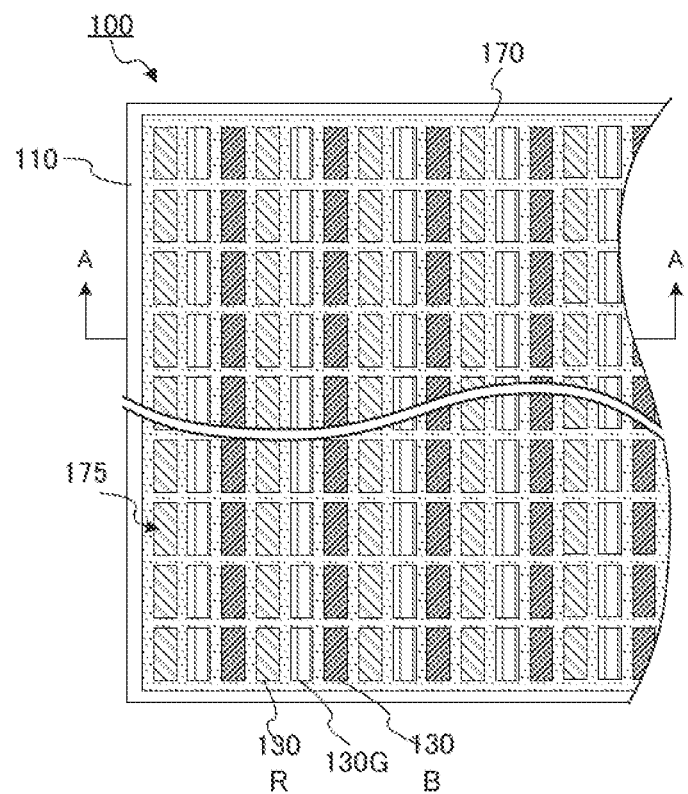
FIGS. 3A and 3B illustrate an organic EL display panel according to the present invention.

In the case where the bank defines a matrix of coating spaces, the organic EL display panel includes a lattice-shaped bank (see FIG. 3A). Accordingly, the discrete coating spaces of the respective sub-pixels are entirely surrounded by the bank. On the other hand, when the coating spaces are defined linearly, the organic EL display panel includes multiple linear banks arranged side by side. A row of multiple sub-pixels which emit the same color or light is arranged to share one linear coating space.

The material of the bank is not specifically limited so long as it is insulating. Examples of materials of the bank include insulating resins such as polyimides. The bank surface preferably has low wettability, e.g., lyophobic property. To achieve low wettability on the bank surface, for example, insulating resin containing fluorine resin may be employed as the material of the bank, or the bank surface can be fluorinated by treatment with fluorine gas plasma.

According to the present invention, the sizes of the coating spaces of respective sub-pixels which emit the same color of light are the same. Specifically, the size of the coating space of sub-pixel X and the size of the coating space of sub-pixel Y are the same. As used herein, "coating space(s) of sub-pixel(s)" means, when each sub-pixel includes a coating space which is entirely surrounded by a bank, discrete coating space(s) entirely surrounded by a bank. On the other hand, when a row of multiple sub-pixels which emit the same color of light is arranged to share one linear coating space, the term means spaces obtained by equally dividing the linear coating space by the number of sub-pixels arranged in a row.

Figure 4A:
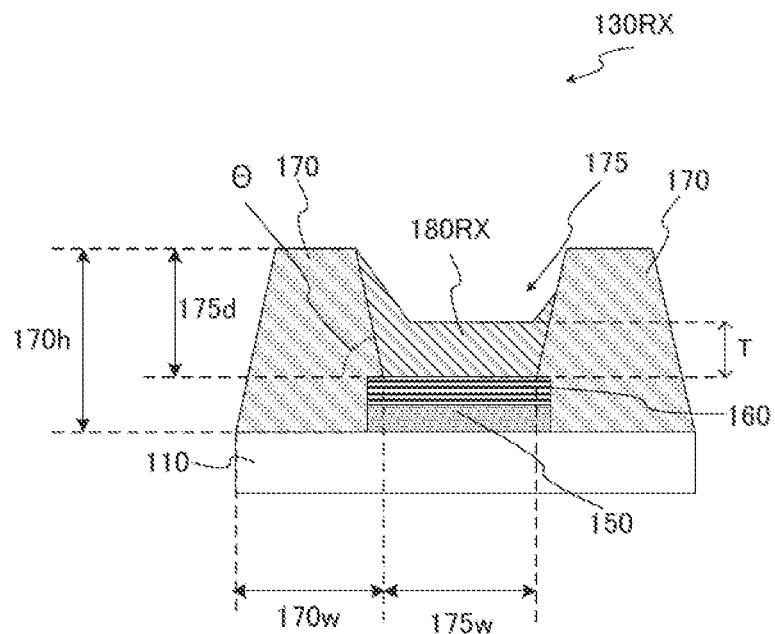
FIGS. 4A and 4B are cross-sectional views illustrating a sub-pixel contained in the organic EL display panel according to the present invention.
Figure 4B:
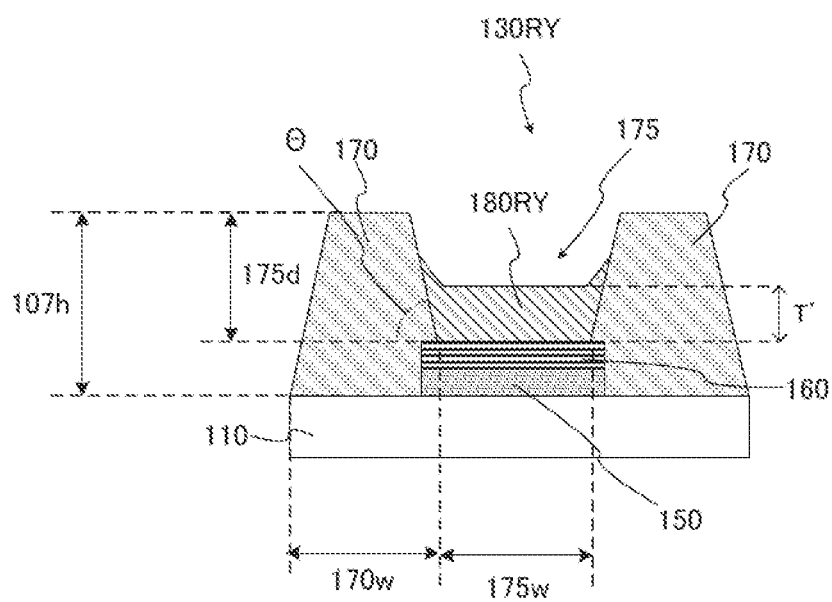

Further, "the sizes of coating spaces are the same" means that, for example, the sizes (widths and lengths) of the bottom surfaces of coating spaces (area of a substrate surface that is surrounded by a bank), depths of the coating spaces, and the taper angles of the banks which define the coating spaces are the same (see FIGS. 4A and 4B). As used herein, "same" means that the difference is 10% or less.

3) Organic Functional Layer

An organic functional layer is disposed on a pixel electrode and contains at least an organic emitting layer. In the present invention, a coating solution of the organic functional layer is applied in a coating space defined by banks to form the organic functional layer therein. For example, the coating solution—a solution prepared by dissolving materials of the organic functional layer into organic solvent such as anisole or cyclohexylbenzene—is applied by coating (e.g., inkjet printing), followed by drying, and thereby, the organic emitting layer can be formed. The thickness of the organic functional layer is not specifically limited; for example, the thickness may be around 50-200 nm.

The choice of organic EL material of the organic emitting layer in the organic functional layer is appropriately determined depending on the color (R, G, or B) of light to be produced from the sub-pixel (organic EL element). The organic EL materials may be either of a polymeric or low molecular weight organic EL material. It is however preferable to employ polymeric organic EL material in view of the fact that the organic emitting layer is prepared by coating. Using the polymeric organic EL material, the organic emitting layer can be readily formed without damaging other members. Examples of the polymeric organic EL material includes polyphenylenevinylene and its derivatives, polyacetylene and its derivatives, polyphenylene (PP) and its derivatives, polyparaphenylene ethylene and its derivatives, poly-3-hexylthiophene (P3HT) and its derivatives, and polyfluorene (PF) and its derivatives. Examples of the low-molecular weight organic EL material includes tris(8-quinolinolate)aluminum.

The organic functional layer may include a hole injection layer, a hole transport layer (interlayer), an electron injection layer and/or an electron transport layer, in addition to the organic emitting layer.

The hole injection layer contains, for example, poly(3,4-ethylenedioxythiophene) doped with polyethylene sulfonate (called "PEDOT-PSS") or derivative thereof (e.g., copolymer). Such a hole injection layer is formed by applying a coating solution of the hole injection layer (ink containing PEDOT-PSS in water) onto a pixel electrode.

The hole transport layer is disposed between the pixel electrode (or hole injection layer) and the organic emitting layer. The hole transport layer efficiently transport holes to the organic emitting layer and blocks injections of electrons into the pixel electrode (or hole injection layer). The material of the hole transport layer is preferably a copolymer of polyfluorene and a triphenylamine derivative.

The hole transport layer can be formed by applying a coating solution (e.g., a solution prepared by dissolving hole transport layer material into organic solvent such as anisole or cyclobenzen) onto the pixel electrode (or hole injection layer). The thickness of the hole transport layer is not specifically limited and may be around 10-40 nm, for example.

When the organic functional layer includes a hole injection layer and a hole transport layer, and so on, a light reflective electrode can be employed for the pixel electrode, so that the optical distance between the organic emitting layer and pixel electrode can be adjusted by adjusting the thicknesses of the hole injection layer and hole transport layer to be coated. In particular, the hole transport layer is suitable as a layer for adjusting the above optical distance. The reason for this is that an electroluminescence characteristics of the organic EL element is hardly influenced even when its thickness somewhat changed. By adjusting the optical distance by means of the hole injection layer and/or hole transport layer in this way, it is possible to enhance light extraction efficiency from the organic EL element. In this case, an optimal optical distance differs depending on the wavelength of light. Thus, in the cases where a hole injection layer and/or hole transport layer is formed to adjust the optical distance, the thickness of the hole injection layer or hole transport layer should differ from one color to another among R, G, and B, so does the thickness of the organic functional layer.

In this way, when the thickness of the organic functional layer varies depending on the color of R, G, or B, the size of the coating space of a sub-pixel preferably varies depending on the color of R, G, and B, according to the thickness of the organic functional layer.

Meanwhile, the organic functional layers of sub-pixels which emit the same color of light are preferably uniform in thickness. This is because variations in organic functional layer thickness among sub-pixels which emit the same color of light results in luminance variations across the organic EL display panel. In particular, when the optical distance is adjusted by means of organic functional layer, variations in organic functional layer thickness among sub-pixels which emit the same color of light result in two types of sub-pixels: one having an appropriately adjusted optical distance, and the other having a poorly adjusted optical distance. Non-uniform optical distances lead to remarkable luminance variations.

As used herein, "thickness of organic functional layer" means a thickness of an organic functional layer as measured at the thinnest portion (see FIGS. 4A and 4B).

According to the present invention, the volume of the organic functional layer of sub-pixels which emit the same color of light varies depending on which part of the substrate the sub-pixels are located on. More specifically, the volume of the organic functional layer in sub-pixel X disposed at the substrate edge is larger than the volume of the organic functional layer in sub-pixel Y disposed at the substrate center.

To make the volume of the organic functional layer in sub-pixel X larger than the volume of the organic functional layer in sub-pixel Y, the volume of the organic functional layer material to be supplied to the coating space of sub-pixel X may be made larger than the volume of the organic functional layer material to be supplied to the coating space of sub-pixel Y. To increase the volume of the organic functional layer material to be supplied, the volume of coating solution of the organic functional layer that is to be applied may be made constant and the concentration of the organic functional layer material may be increased in the coating solution; or the concentration of the organic functional layer material that is to be applied may be made constant and the volume of coating solution of the organic functional layer that is to be applied may be increased. When making the concentration of the coating solution constant and adjusting the volume of coating solution, because it is only necessary to prepare coating solution of one concentration, it is possible to easily adjust the volume of the organic functional layer material to be supplied.

In this way, according to the present invention, the size of the coating space of sub-pixel X and the size of the coating space of sub-pixel Y are made the same, and the volume of the organic functional layer in sub-pixel X is made larger than the volume of the organic functional layer in sub-pixel Y.

By this means, by making the sizes of the coating regions of sub-pixels which emit the same color of light and by changing the volumes of the organic functional layers according to which part of the substrate the sub-pixels are located on, it is possible to correct variations in thickness of the organic functional layer, which are caused by variations in drying, among pixels. A mechanism for correcting variations in thickness of the organic functional layer will be described in detail later with reference to the drawings.

4) Counter Electrode

The counter electrode is an electrically conductive member disposed over organic functional layer(s). The counter electrode generally serves as a cathode, but may also serve as an anode. Multiple sub-pixels may share one counter electrode. For example, in the case of an active-matrix organic EL display panel, all of the sub-pixels of the entire display panel may share one counter electrode.

The material of the counter electrode varies depending on whether the organic EL display panel according to the present invention is of bottom emission type or top emission type. In the case of top emission type, the material of the counter electrode is not specifically limited so long as it is transparent and electrically conductive. Examples thereof include ITO, IZO, ZnO, barium, aluminum, and tungsten oxide. Meanwhile, in the case of bottom emission type, the material of counter electrode is not specifically limited so long as it is electrically conductive. Examples thereof include barium, barium oxide, and aluminum.

A sealing film may also be disposed on the counter electrode. The sealing film protects the organic functional layers and pixel electrodes against moisture, heat, and impact. Examples of materials of the sealing film include silicon nitride and silicon oxynitride.

Next, the present invention will be described with reference to drawings. The present invention is not limited to the organic EL display panel shown in drawings.

Figure 3B:
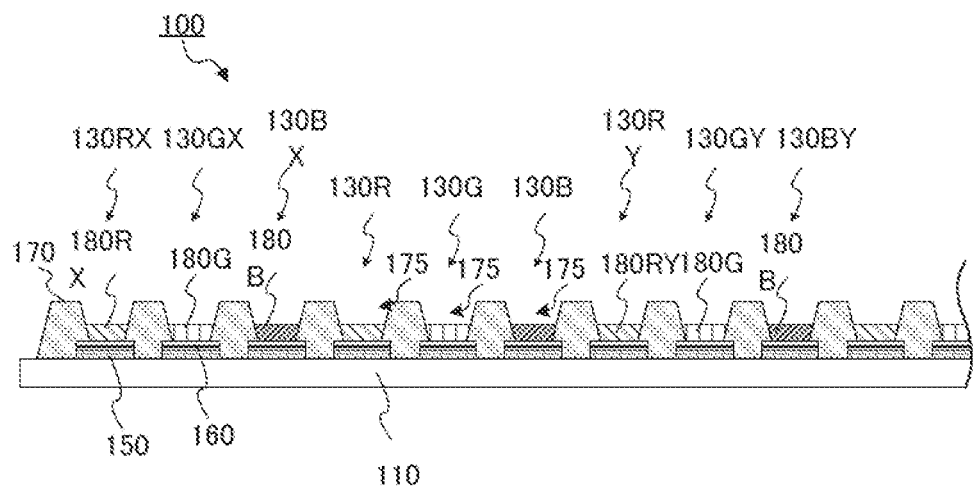

FIG. 3A is a plane view illustrating organic EL display panel 100 according to Embodiment 1 of the present invention. FIG. 3B is a cross-sectional view of organic EL display panel 100 in FIG. 3A cut along A-A line.

As illustrated in FIG. 3, organic display panel 100 includes substrate 110 and a matrix of multiple sub-pixels (organic EL elements) 130 disposed on the substrate. Sub-pixels 130 include sub-pixels 130R which emit red light, sub-pixels 130G which emit green light, and sub-pixels 130B which emit blue light. One set of sub-pixel 130R, sub-pixel 130G, and sub-pixel 130B constitutes one pixel.

Further, as illustrated in FIG. 3B, sub-pixel 130s include sub-pixels 130X (130RX, 130GX, and 130BX) that are disposed at the edge of substrate 110 and sub-pixels 130Y (130RY, 130GY, and 130BY) that are disposed at the center of substrate 110.

As illustrated in FIG. 3B, each sub-pixel 130 includes pixel electrode 150 disposed on substrate 110, metal oxide film 160 disposed on the pixel electrode, bank 170 which defines coating space 175 that is entirely surrounded by the bank, organic functional layer 180 formed in coating space 175, and counter electrode 190 (not shown) disposed on organic functional layer 180. Organic functional layer 180 is disposed on metal oxide film 160. Further, bank 170 is formed in a lattice pattern.

Metal oxide film 160 is made of, for example, tungsten oxide and functions as a hole injection layer.

Organic functional layer 180R contained in sub-pixel 130R includes an organic emitting layer which emits red light; organic functional layer 180G contained in sub-pixel 130G includes an organic emitting layer which emits green light; and organic functional layer 180B contained in sub-pixel 130B includes an organic emitting layer which emits blue light.

FIG. 4A is an enlarged view of sub-pixel 130RX illustrated in FIG. 3B, and FIG. 4B is an enlarged view of sub-pixel 130RY illustrated in FIG. 3B.

As illustrated in FIGS. 4A and 4B, according to the organic EL display panel 100 of the present invention, the size of coating space 175 of sub-pixel 130RX is the same as the size of coating space 175 of sub-pixel 130RY. More specifically, the widths 175w of the bottom surfaces of coating spaces 175 (lengths of the minor axises of the bottom surfaces of coating spaces 175), the lengths of the bottom surfaces of coating spaces 175 (lengths of the major axises of the bottom surfaces of coating spaces 175; (not shown), depths 175d of coating spaces 175, and taper angles θ of banks 170 that define coating space 175 are the same between sub-pixel 130RX and sub-pixel 130RY.

To make depths 175d of coating spaces 175 uniform, heights 170h of banks 170 may be uniform. Further, to make taper angles θ of the banks uniform, heights 170h and widths 170w of banks 170 may be uniform.

A bank is formed usually by baking a patterned resin film, and the taper angle of a bank is formed as a result of thermal expansion of the bottom surface of the resin film during baking. For this reason, the banks having the same height and width usually have the same taper angle.

On the other hand, the volume of organic functional layer 180RX in sub-pixel 130RX is larger than the volume of organic functional layer 180RY in sub-pixel 130RY.

Figure 2A:
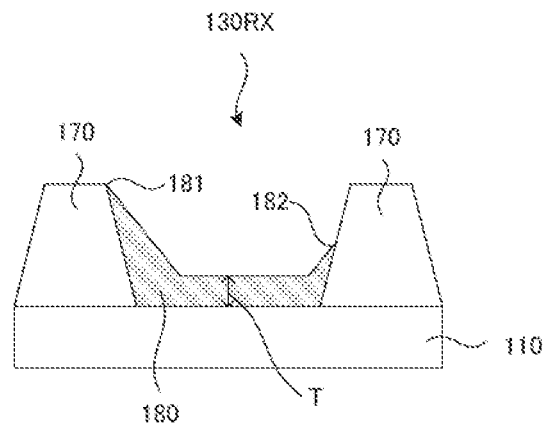
FIGS. 2A and 2B illustrate a functional layer formed by coating.
Figure 2B:
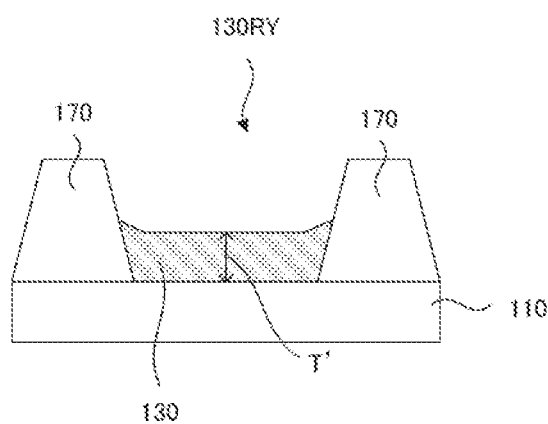

As described above, in the sub-pixels disposed at the substrate edge, the organic functional layer are thicker at the substrate edge side (see FIGS. 1 and 2). Thus, when the volume of the organic functional layer material to be supplied to a sub-pixel at the substrate center is the same as that of the organic functional layer material to be supplied to a sub-pixel at the substrate edge, the organic functional layer of a sub-pixel at the substrate edge may become thinner than the organic functional layer of a sub-pixel at the substrate center (see FIGS. 1 and 2).

On the other hand, as illustrated in FIGS. 4A and 4B, by making the size of coating space 175 of sub-pixel 130X same as the size of coating space 175 of sub-pixel 130Y and by making the volume of coating solution of organic functional layer 180X larger than the volume of coating solution of the organic functional layer 180Y, thickness T of organic functional layer 180X eccentrically located at the substrate edge increases. As a result, thickness T of the organic functional layer 180X becomes the same as thickness T' of organic functional layer 180Y.

In this way, according to the present invention, by making the sizes of the coating spaces of sub-pixels which emit the same color of light uniform, and by adjusting the volume of the organic functional layer of the sub-pixels which emit the same color of light according to which part of the substrate on which the sub-pixels are disposed, it is possible to correct variations in thickness of the organic functional layer that is caused by variations in drying among pixels. It is thus made possible to provide organic EL display panels having uniform thickness among pixels.

Further, it is preferable that the volume of the organic functional layer of sub-pixels which emit the same color of light gradually decreases with approaching the drying center point from the substrate edge. As used herein, "drying center point" means a virtual point at which the drying rate of a coating solution applied becomes the smallest during manufacture of an organic EL display panel. The drying center point may appear inside or outside the panel.

Figure 5A:
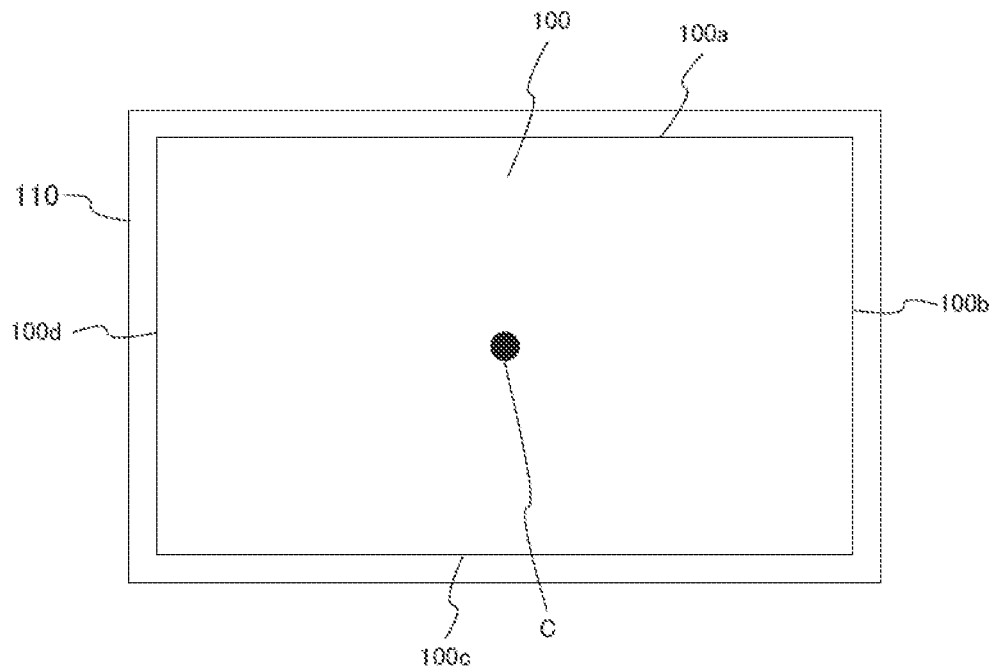
FIGS. 5A and 5B are diagrams for explaining the drying center point.

For example, when one organic EL display panel 100 is to be manufactured from one substrate 110 as illustrated in FIG. 5A, drying center point C appears at the center of organic EL display panel 100. In this case, the volume of coating solution of the organic functional layer is determined in such a way that it becomes maximum in the sub-pixels arranged at the four edges (100a, 100b, 100c, and 100d) of organic EL display panel 100 and gradually decreases with approaching drying center point C.

Figure 5B:
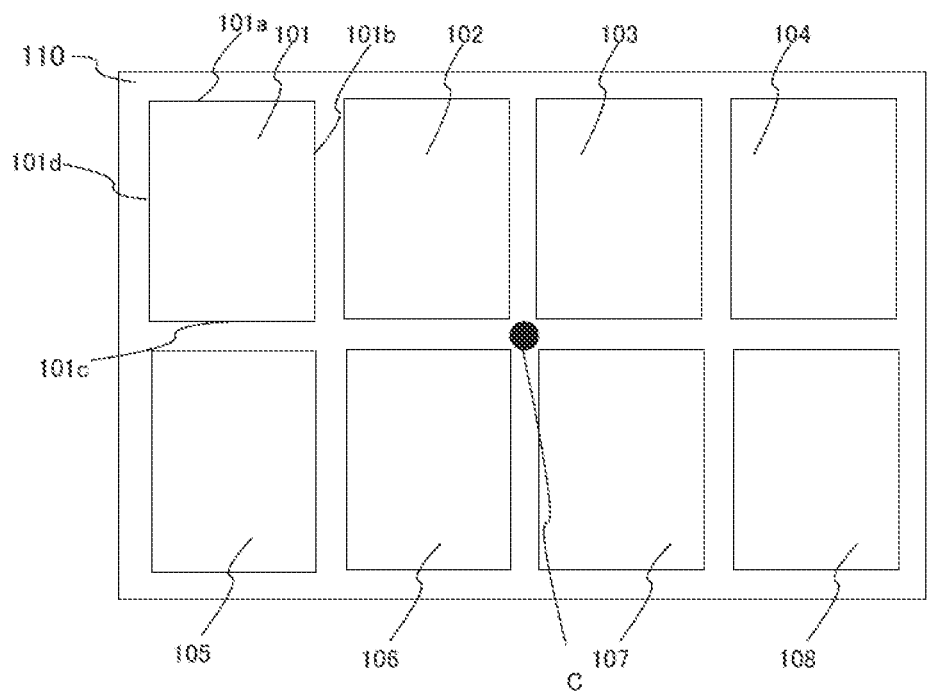

When multiple (e.g., 8) organic EL display panels 101-108 are to be manufactured from one substrate 110 as illustrated in FIG. 5B, drying center point C may appear outside any of the panels. In organic EL display panel 101 for example, the volume of coating solution of the organic functional layer is determined in such a way that it becomes maximum in the sub-pixels arranged at edges 101a and 101d among four edges of organic EL display panel 101 (101a, 101b, 101c, and 101d) and gradually decreases with approaching drying center point C. Similarly with this case, the volume of coating solution of the organic functional layer in the sub-pixels at edges 101a and 101d are larger than those in the sub-pixels at the center of panel 101, which emit the same color of light as the sub-pixels positioned at edges 101a and 101d.

The disclosure of Japanese Patent Application No. 2009-154240, filed on Jun. 29, 2009, including the specification, drawings and abstract, is incorporated herein by reference in its entirety.

INDUSTRIAL APPLICABILITY

According to the present invention, it is possible to provide organic EL display panels having little luminance variation.

REFERENCE SIGNS LIST

100 Organic EL display panel
110 Substrate
130 Sub-pixel
140 Coating solution
150 Pixel electrode
160 Metallic oxide film
170 Bank
175 Coating space
180 Organic functional layer
181 Edge of organic functional layer at substrate edge side
182 Edge of organic functional layer at substrate center side

The invention claimed is:

1. An organic EL display panel comprising:
a substrate; and
a matrix of multiple sub-pixels disposed on the substrate, wherein:
the sub-pixels include a sub-pixel R configured to emit red light, a sub-pixel G configured to emit green light, and a sub-pixel B configured to emit blue light;
each of the sub-pixels R, G, and B has a pixel electrode disposed on the substrate, a hole injection layer made of metal oxide and disposed on the pixel electrode, an organic emitting layer formed on the hole injection layer by coating, a counter electrode disposed on the organic emitting layer, and a bank for defining a space in which the organic emitting layer is formed and covering an edge of the hole injection layer in contact with an edge of an upper surface of the hole injection layer;
the sub-pixels R, G, and B include a sub-pixel X disposed at least in part of an edge of the substrate, and a sub-pixel Y disposed at a center of the substrate and configured to emit the same color of light as the sub-pixel X;
a volume of the organic emitting layer in the sub-pixel X is larger than a volume of the organic emitting layer in the sub-pixel Y;
a size of the space defined by the bank of the sub-pixel X and a size of the space defined by the bank of the sub-pixel Y are the same, and
a thickness of the organic emitting layer of the sub-pixel X and a thickness of the organic emitting layer of the sub-pixel Y are the same.

2. The organic EL display panel according to claim 1, wherein a thickness of the hole injection layer is constant over the space defined by the bank.

3. The organic EL display panel according to claim 1, wherein the pixel electrode is a reflective electrode, and a thickness of the hole injection layer varies depending on a color of light emitted by the sub-pixel to which the hole injection layer is provided.

\* \* \* \* \*